United States Patent [19]

George et al.

[11] 4,355,415
[45] Oct. 19, 1982

[54] TUNING MODE ARRANGEMENT USEFUL FOR RESTRICTING CHANNEL SELECTION TO CERTAIN CHANNELS

[75] Inventors: John B. George; William J. Testin, both of Indianapolis, Ind.

[73] Assignee: RCA Corporation, New York, N.Y.

[21] Appl. No.: 144,828

[22] Filed: Apr. 29, 1980

[51] Int. Cl.³ ............................................. H04B 1/26
[52] U.S. Cl. .................................. 455/185; 455/186; 455/166
[58] Field of Search ............... 455/185, 186, 182, 183, 455/180, 188, 192, 26, 151, 27, 160, 4, 166, 170, 175, 179, 255, 256; 358/114, 115, 119, 122, 86, 195.1

[56] References Cited

U.S. PATENT DOCUMENTS

| | | | |
|---|---|---|---|
| 4,031,474 | 6/1977 | Ehni | 455/186 |
| 4,031,549 | 6/1977 | Rast et al. | 455/192 |
| 4,131,853 | 12/1978 | Dreiske | 455/185 |
| 4,164,711 | 8/1979 | Steckler et al. | 455/186 |
| 4,236,251 | 11/1980 | Ohgishi | 455/186 |

OTHER PUBLICATIONS

RCA Television Service Data–Chassis CTC 93 Series, File 1978 C-7.
Frequency Synthesis Custom LSI: The Inside Story, by H. Blatter, IEEE Transactions on Consumer Electronics, vol. CE-24, No. 3, pp. 429–435, Aug. 1978.
RCA—Television Service Data Hotel/Motel/Hospital Series, File 1976 C1-1S1.

Primary Examiner—Tommy P. Chin
Attorney, Agent, or Firm—E. M. Whitacre; P. J. Rasmussen; P. M. Emanuel

[57] ABSTRACT

A television tuning system includes a memory for storing tuning information with first and second groups of memory locations for storing different tuning information for the same group of predetermined channels. A mode switch, in a first mode, allows memory locations in the first group to be addressed when channels in the predetermined group are selected and in a second mode allows memory locations in the second group to be addressed when channels in the predetermined group are selected. Such an arrangement is useful in a motel, hotel or hospital to allow certain channels in a list of channels to be selected when a rental fee has been paid and to exclude those certain channels when the rental fee has not been paid.

10 Claims, 3 Drawing Figures

TUNING MODE ARRANGEMENT USEFUL FOR RESTRICTING CHANNEL SELECTION TO CERTAIN CHANNELS

BACKGROUND OF THE PRESENT INVENTION

The present invention concerns a mode switching arrangement for a tuning control system of a radio or television receiver which enables all the channels in a group of channels to be selected in a first mode and only certain designated channels to be selected in a second mode.

Such mode switching arrangements are often employed in television receivers used in hospitals, hotels, or motels to enable those persons who have paid a rental fee to watch any channel in a group of channels, while restricting those who have not paid the rental fee to watch only certain channels in the group. Prior mode switching arrangements have comprised mechanical apparatus such as cams to restrict the channels which may be viewed if the fee was not paid. Since many modern tuning systems are almost entirely electronic, mechanical arrangements cannot be readily incorporated to provide such mode selection operations.

SUMMARY OF THE INVENTION

In summary, the present invention includes a channel number register of generating coded binary signals corresponding to various channels in a predetermined group; a plurality of memory locations for storing information associated with the tuning of the channels which are addressed in response to the contents of the channel number register; and mode selection apparatus for addressing memory locations in a first group of memory locations, in response to bianry signals corresponding to channels in the predetermined group in a first mode and for addresing memory locations in a second group in response to the binary signals corresponding to the same channels in the predetermined group in a second mode. This arrangement permits memory locations in the first and second groups to be programmed differently for the same channels so that certain channels are selected in the first mode available, e.g., on the payment of a rental fee, while only certain other channels can be selected in the second mode.

DETAILED DESCRIPTION OF THE PREFERRED EMBODIMENT OF THE PRESENT INVENTION

Figure 1:
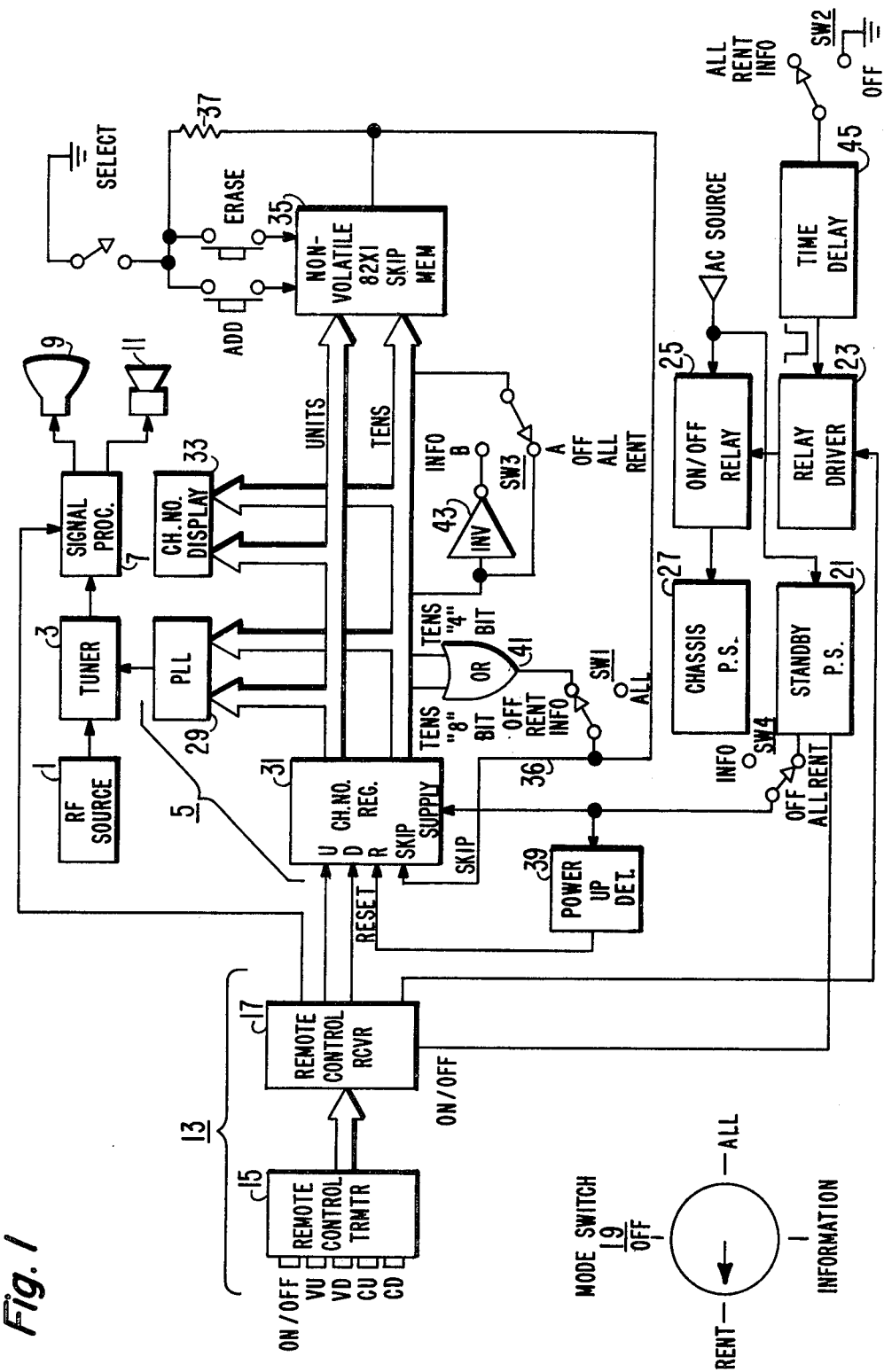
FIG. 1 is a schematic, partially in block form, of a television receiver employing a tuning control system with a mode selection arrangement of the type referred to above for use in a hospital environment constructed in accordance with the present invention.

Referring now to FIG. 1, an RF source 1 supplies RF carriers in the television range to a television receiver. Typically, in a hospital, RF source 1 is a cable system which provides both broadcast carriers received by a master antenna, cable carriers provided by a commercial cable company, and hospital carriers generated by the hospital in a closed circuit network.

A tuner 3 filters the RF carriers to select the carrier corresponding to a selected channel and heterodynes it with an internally generated local oscillator signal having a frequency corresponding to the selected channel to derive an IF signal. Tuner 3 is controlled in response to a tuning voltage generated by a frequency synthesizer 5. The IF signal is filterd and amplified by signal processing section 7 to produce picture and sound signals which are applied to a picture tube 9 and a speaker 11, respectively.

Various functions of the televison receiver, i.e., on-off control, channel selection and volume control, are controllable by a remote control unit 13. Remote control unit includes a transmitter 15 for transmitting command signal in response to the activation of respective pushbuttons and a receiver 17 for receiving the command signals and generating respective control signals for controlling various functions of the television receiver. Typically, in a hospital, remote control transmitter 15 and remote control 17 are wired together rather than ultrasonically or optically coupled, as is typically the case in remote control systems intended for the home.

The present invention television receiver includes a mode selection switch 19, comprising a key lock mechanism (not shown) and a wafer switch having ganged or synchronously controlled wafer switch sections SW1, SW2, SW3 and SW4, which may be locked by the operation of a key into one of four positions: INFORMATION, RENT, OFF and ALL. Three of these positions: INFORMATION, RENT and OFF are intended for use in a hospital. In the INFORMATION position, only hospital closed-circuit channels, by which information pertaining to hospital services and schedules is provided, can be selected. In the RENT position any of the available broadcast channels, cable channels, as well as the hospital channels can be selected. Typically, upon payment of a fee, a hospital attendant switches mode switch 19 to the RENT position. In the OFF position, the television receiver cannot be turned on by means of the patient control. The latter is intended to be used when a completely quiet environment is required. In the ALL position, the television receiver can be operated as a commercial television receiver. This position is provided so that the receiver may be resold by the hospital as a conventional receiver.

Figure 2:
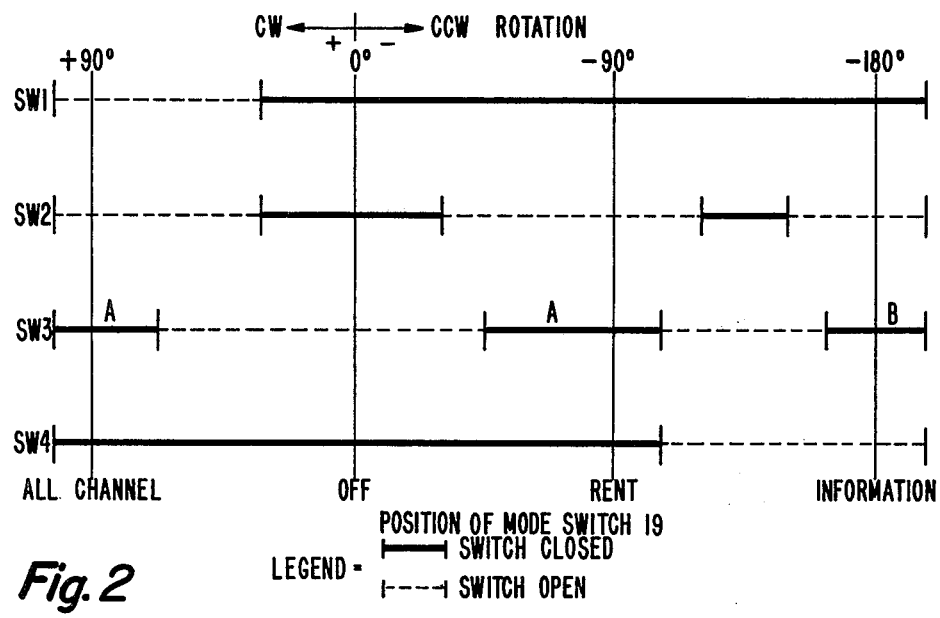
FIG. 2 is a contact position diagram indicating the various conditions of operation for a wafer switch employed in the mode selection arrangement shown in FIG. 1.

A series H wafer switch manufactured by Oak Manufacturing Company of Crystal Lake, Ill., is suitable for use, with the contact closure relationship indicated in FIG. 2, as the wafer switch portion of mode switch 19. Model number SW5-3058 key lock mechanism manufactured by Fort Lock Corporation of River Grove, Ill., is suitable for use as the key lock mechanism of mode switch 19.

The operation of remote control system 13 to turn the receiver on and off, control the volume and change channels is the same in each of the ALL, INFORMATION and RENT modes.

A standby power supply 21, directly connected to the a-c line source, supplies an operating voltage to remote control receiver 17 so that it is in condition to accept command signals. In response to the depression of an ON/OFF pushbutton or remote control transmitter 13, remote control receiver 17 generates a high level command signal which causes a relay driver 23 to activate a relay 25 so that its normally opened contacts are closed. As a result, the a-c line source is connected to a chassis power supply 27, which supplies operating voltages to various portions of the television receiver, and the television receiver is placed in the on state. When the ON-/OFF pushbutton is again depressed, the contacts of relay 25 open and the television receiver is placed in the off state.

In response to the depression of a VU (Volume Up) pushbutton on remote control transmitter 15, remote control receiver 17 causes the level of a d-c volume control signal applied to signal processing unit 7, to increase. When a VD (Volume Down) pushbutton is depressed, the level of the d-c volume control signal is decreased.

Freqency synthesizer 5 includes a phase locked loop 29 for generating the tuning voltage in response to binary signals representing the channel number of the selected channel stored in a channel number register 31. The contents of channel number register 31 are partitioned into first group of four binary signals arranged in binary coded decimal (BCD) format to represent the tens digit of the selected channel number and a second group of binary signals arranged in BCD format to represent the units digit of the selected channel number. A frequency synthesizer for generating a tuning voltage for a television tuner of the same type is disclosed in detail in U.S. Pat. No. 4,031,549, entitled "Television Tuning System with Provisions for Receiving RF Carriers at Nonstandard Frequency" issued in the name of Rast et al. on June 21, 1977, which is incorporated by reference.

Channel number register 31 includes an up/down counter arrangement (not specifically shown) responsive to the depression of CU (Channel Up) and CD (Channel Down) channel selection pushbuttons 39 on remote control transmitter 15. When the CU pushbutton is depressed remote control transmitter 17 applies a corresponding control switch to an U (Up) control input of channel number register 31 which causes the stored channel number to increase. When the CD pushbutton is depressed, a corresponding control signal is applied to a D (Down) control input of register 31 which causes the stored channel number to decrease.

The contents of channel number register 31 are applied to a channel number display unit 33, which may comprise a light-emitting diode array on an on-screen display apparatus.

The contents of channel number register 31 are also applied to a skip memory 35. Before describing the cooperation of channel number register 31 and skip memory 35 when mode switch 19 is in the RENT and INFORMATION positions, with which the present invention is primarily concerned, a description of the cooperation of channel number register 31 and skip memory 35 when mode switch 19 is in the ALL position is helpful. Assume, then, that mode switch 19 is in the ALL position so that the switch arms of wafer sections SW1, SW2, SW3 and SW4 are thrown to the ALL contact position.

Skip memory 35 includes a single-bit memory location for each channel that may be selected (e.g., in the United States, 82 memory locations are needed for the 82 channels between channels 2 and 83). Each memory location may be programmed, as described below, to store either a binary "1" or a binary "0". A binary "1" indicates that the corresponding channel is to be skippped during channel selection and therefore prevented from being tuned. A binary "0" indicates the corresponding channel will not be skipped. The memory locations are addressed in response to the contents of channel number register 31 when the CHANGE signal is generated. When an addressed memory location contains a binary "1", a SKIP signal is applied to channel number register 31 via a skip line 36 which causes its contents to be changed, i.e., increased if the CU pushbutton has been depressed and decreased if the CD pushbutton has been depressed, until a memory location containing a binary "0" is reached.

Skip memory 35 is a non-volatile EAROM (Electronically Alterable Read Only Memory) comprising, e.g., an integrated circuit array of MNOS (Metal Nitride Oxide Semiconductor) memory cells. Such a nonvolatile memory is described in an article entitled "Digital Television Tuner Uses MOS LSI and Nonvolatile Memory" by Penner appearing in "Electronics", dated Apr. 1, 1976. The information stored in such a memory is maintained even in the complete absence of supply voltage.

To program skip memory 35, a single pole, single throw switch labeled SELECT is closed. This causes the non-desired channel skipping feature to be defeated to enable all channels, whether or not previously programmed to be skipped, to be selected. Specifically, when SELECT switch is closed, the SKIP line 30 is connected to ground through resistor 37, thereby preventing the high voltage level corresponding to binary "1" from being developed. As a result, if a binary "1" is stored in an addressed memory location, it is reduced to a binary "0" level and the corresponding channel will not be skipped, enabling its programming to be changed. Once a memory locatin is addressed by depressing either the CU pushbutton or the CD pushbutton switch on remote control transmitter 15, a binary "0" is entered into skip memory 35 by depressing, an ADD pushbutton or a binary "1" is entered into skip memory 35 by depressing an ERASE pushbutton. If neither one of the ADD or ERASE pushbuttons is depressed when SELECT switch is closed, the programming of the selected channel is unchanged.

Unlike nonvolatile skip memory 35, the contents of channel number register 31 will not be maintained without a supply voltage. Therefore a supply voltage from standby power supply 21 is applied to channel number register 31 so that its contents are maintained when the receiver is off. As a result, when the receiver is turned on again, the last channel selected before the receiver was turned off, will automatically be tuned.

However, if the receiver is disconnected from the a-c line or the line voltage temporarily drops for a predetermined period, e.g., for 2 seconds during a lightning storm, the standby power supply voltage is reduced to a level at which the contents of channel number register 31 will not be maintained. When the line voltage returns and the standby voltage reaches a predetermined level, a power up detector 39 senses the latter occurrence and, in response, generates a RESET pulse which is applied to an R (Reset) input of channel number register 31. In response to the RESET pulse, channel number register 31 is reset to a predetermined condition corresponding to a predetermined channel number, e.g., the lowest channel number, 2. As a result, the corresponding memory location of memory 35 is addressed. If a binary "0" is stored in the addressed memory location, the contents of channel number register 31 are maintained and the corresponding channel is tuned. If a binary "1" is stored, the contents of channel number register are changed in a predetermined order, e.g., increasing order, until a desired channel is located. Thus, if power has been removed, when power is returned the first desired channel in increasing order is tuned.

When mode switch 19 is in the RENT position, wafer section SW1 connects the output of an "OR" gate 41 to the SKIP input of channel number register 31. The inputs of OR gate 41 receive the binary signals or bits (binary digits) representing 8 and 4 in the group of binary signals representing the tens digit of the channel number stored in channel number register 31. When either the 8 bit or 4 bit of the group of bits representing the tens digit of the channel number is a binary "1", indicating that the channel number is either greater than or equal to 80 or greater or equal to 40 but less than 80, OR gate 41 applies a binary "1" to the SKIP input of channel number register 31. As a result, when mode switch 19 is in the RENT position, the contents of channel number register 31 will be automatically changed to prevent the selection of channel numbers between 40 and 83. Viewed another way, channel numbers between 40 and 83 will automatically be bypassed and only channel numbers between 2 and 39 can be selected.

Since, when mode switch 19 is in the RENT position, as distinguished from the situation when mode switch 19 is in the INFORMATION position discussed below, the binary signals applied to skip memory 35 are unaltered, when any of channel numbers between 2 and 39 is selected the respective one of the memory locations of skip memory 35 for channels between 2 and 39 will be addressed. Thus, the memory locations for channels between 2 and 39 can be programmed so that the respective channels between 2 and 39 will be tuned or skipped when switch 19 is in the RENT position. This enables the hospital to allocate channels between 2 and 39 for the reception of broadcast, commercial cable and closed circuit carriers. For this purpose, RF source 1 includes a freqeuncy converter for converting the commercial and closed circuit carrier frequencies to frequencies in the frequency range of channels 2 to 39.

Since wafer section SW4 connects standby power supply 21 to channel number register 31 when mode switch 19 is in the RENT position, the contents of channel number register 31 are maintained when the television receiver is turned off. As a result, when the receiver is turned on again, the last channel selected before the receiver was turned off will automatically be tuned.

When mode switch 19 is in the INFORMATION position wafer section SW1 connects the output of OR gate 41 to the SKIP input of channel number register 31 as when mode switch 19 is in the RENT position. As a result, only channels between 2 and 39 can be selected. However, when mode switch is in the INFORMATION position, wafer section SW 3 connects the output of a logic INVERTER 43 to skip memory 35 which causes the contents of channel number register 31 to be modified before they are applied to skip memory 35 so that for any channel between 2 and 39 a respective memory location in a group of memory locations corresponding to channels 42 to 79 is addressed, rather than a respective memory location in the group of memory locations corresponding to channels 2 to 39 as is the case when mode switch 19 is in the RENT position. Specifically, the input of INVERTER 43 receives the bit representing 4 in the group of binary signals representing the tens digit of the channel number and inverts it to form its logic compliment. As a result, when mode switch 19 is in the INFORMATION position for any channel number between 2 and 39, for which the bit representing 4 in the group of binary signals representing the tens digit is a binary "0", binary signals representing a channel number 40 higher than the selected channel number are applied to skip memory 35.

Thus, INVERTER 43 and wafer section SW3 allow the hospital to program skip memory 35 so that different channels in the group between channels 2 and 83 will be skipped or be able to be tuned, depending on whether mode switch 19 is in the RENT or INFORMATION position. Typically, a certian channel or channels between 2 and 39 are allocated to be information channels. These are programmed to be able to be tuned in both the RENT and INFORMATION mode by entering a binary "0" in the respective memory locations in the group of memory locations for channels between 2 and 39 (which are addressed in the RENT mode) and also entering a binary "0" in the respective memory locations in the group of memory locations for channels between 42 and 79 (which are addressed in the INFORMATION mode). The remaining channels between 2 and 39 are allocated for use in the RENT mode. These are programmed to be able to be tuned in the RENT mode but not in the INFORMATION mode by entering a "0" in the respective memory locations in the group of memory locations for channels between 2 and 39 and entering a binary "1" in the respective memory locations in the group of memory locations for channels between 42 and 79. The programming of skip memory 35 is accomplished by the use of the SELECT, ADD and ERASE switches for channels between 2 and 39 when mode switch 19 is in the RENT mode and then again when mode switch 19 is in the INFORMATION mode.

Since chassis power supply 27, rather than stand-by power supply 21, is connected to channel number register 31 when mode switch 19 is in the INFORMATION position, the contents of channel number register 31 are not maintained when the television receiver is turned off. However, since power up detector 39 is connected to chassis power supply 27, when the receiver is turned on again a RESET signal is generated which causes the first information channel to be automatically tuned. So that a patient cannot reprogram skip memory 35 to receive channels available only in the RENT mode in the INFORMATION mode, it is desirable to provide a lockable cover (not shown) for the SELECT, ADD and ERASE switches.

To prevent a channel selected during the RENT mode from being carried over into the INFORMATION mode when the position of mode switch 19 is changed from RENT to INFORMATION while the television receiver is on, due to the continued appication of a supply voltage to channel number register 31 from chassis power supply 27, SW2 is caused to be temporarily placed in the OFF position whenever mode switch 19 is moved between the RENT and INFORMATION positions. As a result, ground potential is applied to a time delay circuit 45 which in response generates a negative-going pulse of a predetermined time delay interval. The negative-going pulse is applied to relay driver 23 and causes the contacts of relay 25 to open for the predetermined time delay interval. The predetermined time delay interval ensures that a-c voltage is removed from chassis power supply 27 for a long enough time to discharge filter capacitors (not shown)

of chassis power supply 27. When the negative-going pulse ends, a-c voltage is reapplied to chassis power supply 27 and a RESET pulse is generated by power-up detector 39 which causes the first information channel to be tuned.

FIG. 2 is a contact position diagram for wafer sections SW1, SW2, SW3 and SW4 of mode switch 19 which indicates their closed and opened conditions for each position of mode switch 19. With respect to the latter description of how rent channels are prevented from being carried over to the INFORMATION mode, note that wafer section SW2 has a closed position between the conditions when mode switch 19 is in the RENT position and contact A of wafer section SW3 is closed and when mode switch 19 is in the INFORMATION position and contact B of wafer section SW3 is closed.

Figure 3:
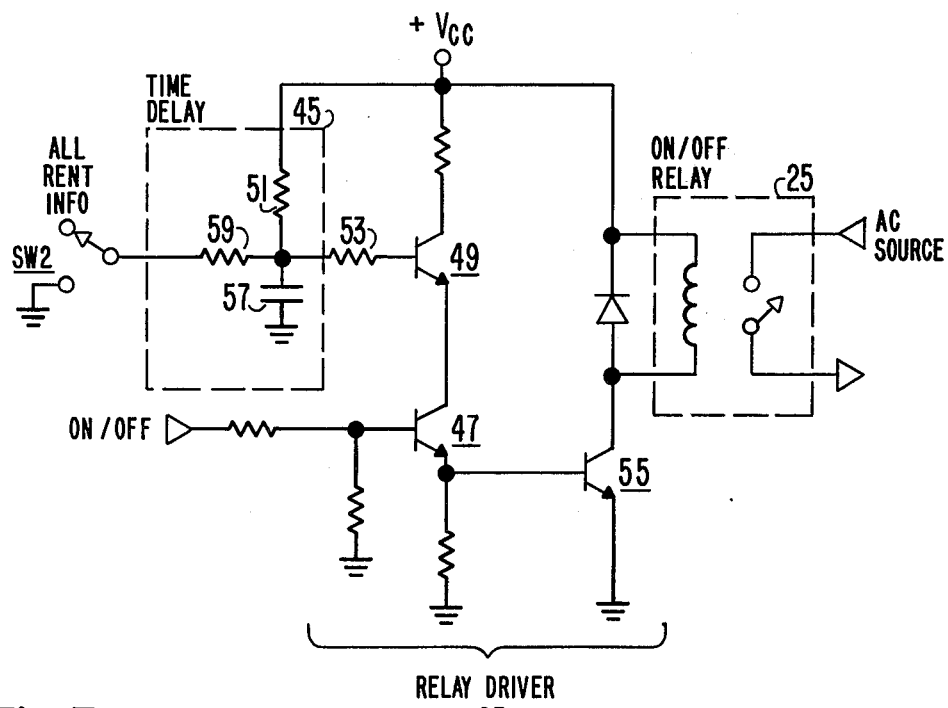
FIG. 3 is a schematic of relay driver 23 and time delay circuit 45 shown in FIG. 1.

FIG. 3 is a schematic of relay driver 23 and time delay circuit 45. Relay driver 23 includes two NPN transistors 47 and 49 configured to form a logic AND gate arrangement having their collector-emitter paths connected in series between a source of positive voltage +VCC and signal ground. Transistor 49 is normally biased to be conductive by the application of +VCC to its base through resistors 51 and 53. When transistor 49 is conductive and the ON/OFF input signal from remote control receiver 17 has a high level, transistor 47 is conductive thereby applying a high level to the base of an NPN transistor 55. As a result, transistor 55 is rendered conductive and +VCC is applied across the coil of relay 25.

When wafer section SW2 is closed a capacitor 57 connected to the base of transistor 49 through resistor 53 is discharged to a level near signal ground through a resistor 59. As long as wafer section SW2 is closed, capacitor 57 remains discharged and transistor 49 remains non-conductive. This causes the contacts of relay 25 to be open. When wafer section SW2 is opened, capacitor 57 begins to charge. At a predetermined time, determined by resistor 51 and capacitor 57 (resistor 53 has a large value compared to resistor 51), capacitor 57 will again be charged to a high enough level to cause transistor 49 to be conductive thereby causing the contacts of relay 25 to close.

When remote control system 13 has been described by way of example as including a remote control transmitter which includes individual pushbuttons for each function to be controlled, it will be appreciated that different remote control arrangements may be employed. For example, the remote control transmitter may simply include a single pushbutton, which when depressed for a first predetermined time causes the on-/off status to change and which when depressed for a second predetermined time causes the selected channel to change, and a potentiometer connected directly to the signal processing unit to control the volume level.

While the present invention has been described in terms of mode selection apparatus for selectively enabling and disabling the selection of different channels intended for use in a hospital conditioned on payment of a rental fee, it may also be employed in other environments. For example, it may be employed in a hotel or motel to enable movie channels to be received only upon the payment of a fee. Furthermore, the mode selection apparatus has general use wherever it is desired to selectively establish different tuning conditions for the same channels. This and other modifications are intended to be within the scope of the present invention defined by the following claims.

What is claimed is:

1. In a receiver, apparatus for tuning said receiver to various channels comprising:
    channel number register means for storing coded groups of binary signals representing channel numbers of selected channels;
    user operable channel selection means for selectively causing said channel number register means to change said binary signals in a given order when operated;
    tuner means responsive to said binary signals for tuning said receiver to corresponding channels;
    memory means including a plurality of memory locations addressed in response to said binary signals, each for storing at least one tuning control signal associated with the tuning of said receiver to a respective channel;
    utilization means responsive to the tuning control signal stored in an addressed one of said memory locations for controlling said apparatus in a predetermined manner; and
    mode selection means interposed between said channel number register means and said memory means in a first mode for selectively causing memory locations in a first group of said memory locations to be addressed in response to said binary signals when said binary signals represent channel numbers in a predetermined group of channel numbers and in a second mode for causing memory locations in a second group of memory locations to be addressed when said binary signals represent channel numbers in said same predetermined group in a second mode.

2. The apparatus recited in claim 1 wherein:
    each of said memory locations stores a skip signal having either a first or a second level; and
    said utilization means includes skip means coupled to said channel number register means and responsive to the skip signal stored in an addressed one of said memory locations to change said binary signals to correspond to the next channel number in said given order when said skip signal has said second level.

3. The apparatus recited in claim 2 wherein:
    said channel number register means generates binary signals representing a predetermined set of channel numbers;
    said memory means includes a respective memory location for each of said set of channel numbers; and
    said mode selection means in said first mode causes memory locations in said first group to be addressed in response to said binary signals when said binary signals represent channel numbers in a first group of channel numbers in said set and causes memory locations in said second group to be addressed in response to said binary signals when said binary signals represent channel numbers in a second group of channel numbers in said set; and in said second mode causes memory locations in said second group to be addressed in response to said binary signals when said binary signals represent channel numbers in said first group of channel numbers in said set.

4. The apparatus recited in claim 3 wherein:

said mode selection means includes modification means which is enabled to operate in said second mode for modifying said binary signals stored in said channel register means before application to said memory means when said binary signals represent channel numbers in said first group to represent channel numbers in said second group; and first switch means for selectively disabling said modification means in a first state and enabling said modification means in a second state.

5. The apparatus recited in claim 4 wherein:
said mode selection means includes channel number bypass means responsive to said binary signals stored in said channel number register for modifying said binary signals stored in said channel number register before application to said channel number register means when said binary signals represent channel numbers in said second group to represent channel numbers in said first group.

6. The apparatus recited in claim 5 wherein:
said bypass means includes detection means responsive to said binary signals stored in said channel number register means for detecting when said binary signals represent a channel number in said second group and in response applying a skip signal having said second level to said skip register means.

7. The apparatus recited in claim 6 wherein:
said modification means modifies said binary signals when said binary signals represent channel numbers in said first group to represent channel numbers in said second group by effectively adding a predetermined number to the channel number represented by said first group.

8. The apparatus recited in claim 7 wherein:
said binary signals stored in said channel number register means include a first group of four binary signals representing in binary coded decimal format the tens digit of the selected channel number and a second group of four binary signals representing in binary coded decimal format the units digit of the selected channel number;
said set of channel numbers includes the channel numbers 2 through 83; said first group of channel numbers includes the channel numbers 2 through 39; and said second group of binary signals includes the channel numbers 40 to 79;
said modification means includes logic "inverter" means for inverting the most significant bit of said first group of binary signals stored in said channel register means before application to said memory means and means for applying the remaining bits of said first and second groups of binary signals stored in said channel register means unaltered to said memory means; and
said bypass means includes a logic "or" means for supplying a skip signal having said second level to said channel register means when either the most significant bit of said first group of binary signals represents the number 8 or the next most significant bit of said first group of binary signals represents the number 4.

9. The apparatus recited in claim 5 wherein:
said mode selection means includes second switch means for selectively disabling said bypass means in a first state and enabling said bypass means in a second state.

10. The apparatus recited in claim 5 further including:
power supply means for supplying a supply voltage to said channel number register means; and wherein:
said mode selection means includes second switch means coupled to said first switch means and to said power supply means for selectively inhibiting said power supply means for supplying said supply voltage to said channel number register means when said first switch means is caused to switch between said first and second states.

* * * * *